(12) United States Patent
Ribak

(10) Patent No.: US 6,728,024 B2
(45) Date of Patent: Apr. 27, 2004

(54) VOLTAGE AND LIGHT INDUCED STRAINS IN POROUS CRYSTALLINE MATERIALS AND USES THEREOF

(75) Inventor: Erez N. Ribak, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 83 days.

(21) Appl. No.: 10/060,143

(22) Filed: Feb. 1, 2002

(65) Prior Publication Data

US 2002/0101130 A1 Aug. 1, 2002

Related U.S. Application Data

(62) Division of application No. 09/613,759, filed on Jul. 11, 2000.

(51) Int. Cl.[7] .............................. G02F 1/29; G02F 1/00; H01L 41/18
(52) U.S. Cl. ................... 359/299; 359/321; 310/311
(58) Field of Search ................ 359/299, 321; 310/311

(56) References Cited

U.S. PATENT DOCUMENTS 4,524,294 A * 6/1985 Brody .................. 310/311

FOREIGN PATENT DOCUMENTS

| JP | 8-32132 | * | 2/1996 |
| JP | 8-46259 | * | 2/1996 |

* cited by examiner

Primary Examiner—Georgia Epps
Assistant Examiner—William Choi
(74) Attorney, Agent, or Firm—G.E. Ehrlich (1995), Ltd.

(57) ABSTRACT

A piezoelectric device is disclosed, which includes a first element of porous crystalline material, a second element being attached to, or integrally formed with, the first element, and at least one electrode being in electrical contact with the first element, such that subjecting the first element to an electric potential via the at least one electrode results in a strain induced by the first element on the second element. Also disclosed is a piezooptic device which includes a first element of porous crystalline material, a second element being attached to, or integrally formed with, the first element, and a light source, such that subjecting the first element to light originating from the light source results in a strain induced by the first element on the second element.

11 Claims, 4 Drawing Sheets

(1 of 4 Drawing Sheet(s) Filed in Color)

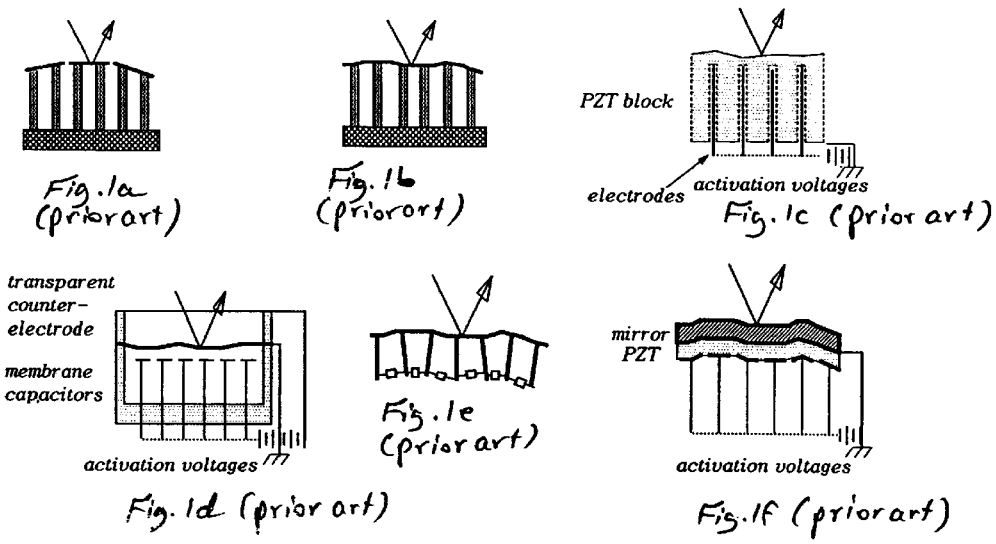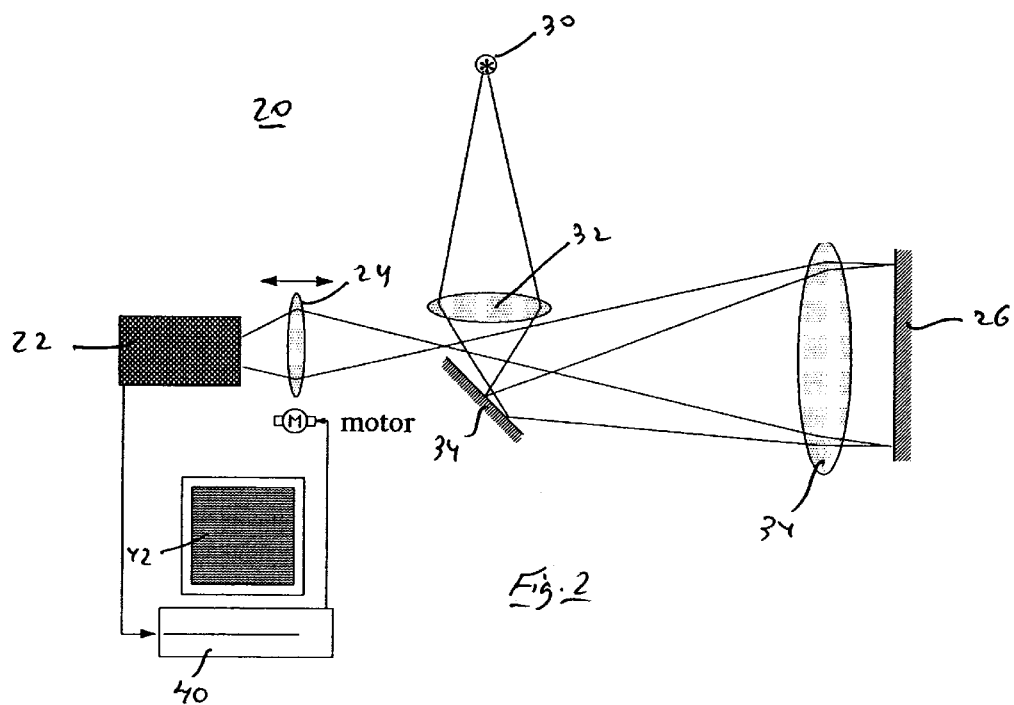

VOLTAGE AND LIGHT INDUCED STRAINS IN POROUS CRYSTALLINE MATERIALS AND USES THEREOF

This is a divisional of U.S. patent application Ser. No. 09/613,759, filed Jul. 11, 2000.

FIELD AND BACKGROUND OF THE INVENTION

The present invention is derived from a striking novel discovery, that porous crystalline materials have piezoelectric and piezooptic properties. The present invention, therefore, relates to devices and methods which take advantage of this newly discovered phenomenon. One main use of this discovery is in the field of adaptive optics, e.g., adaptive reflectors such as mirrors, however, other uses, as is further delineated below, are anticipated. Thus, for example, the new technology can find uses in (i) attached fiber optics maneuvering (movement of fiber for focusing, etc.); (ii) attached fiber optic bending for mode control; (iii) attached fiber optics intensity and polarization control; (iv) spatial light modulation (electro optical and opto-optical modulation) by adjustment of specific elements or a whole device; (v) tunneling devices, where the tunneling current is sensitive to distance between elements; (vi) scanning microscopy heads, optical or magnetic disc readers which have to be maneuvered by electric or light signal; and (vii) light or voltage detectors.

Most of the following background discussion, however, focuses on the construction, fabrication, use, advantages and limitations of prior art adaptive mirrors, however, there is no intention to restrict the use of the newly discovered piezoelectric and piezooptic properties of porous crystalline materials to the field of adaptive optics, as many other uses and applications of this core technology are envisaged.

Adaptive optics systems are essentially a servo loop, with a sensitive wave front sensor, a control computer, and a flexible mirror to correct aberrations in a beam of light. Despite large efforts made in the last few decades, progress in deformable mirrors has been slow, and there are only a few kinds available. The high price of these mirrors is an indicator of the problems in their manufacture, such as complex construction, non-repeatability and non-uniformity.

What is required of an adaptive mirror? It has to be agile enough to correct even the strongest and densest wave front fluctuations (usually a few micrometers in stroke), while not contributing errors of its own. The more elements it has the better, ranging between few and thousands of actuators. It has to be quick enough to correct even the fastest variations, while not resonating close to the operational frequency. It has to run on low power to avoid a cumbersome power supply and control system, while not loosing in dynamic range. It has to be small and light enough to mount in a compact space. It has to be fail-safe or at least allow easy correction or replacement of bad elements. It has to have serial command lines to the elements to avoid massively parallel wiring. Mechanically, it needs to be of good optical quality and insensitive to temperature variations, even without active correction. Finally, it ought to have a sound price, which is derived mainly from its construction technology.

There are many other fields where actuation of devices is a part of their operation: communication devices, switching devices, scanning microscopes, printers, and many more depend on mechanical movement of smaller or larger parts as a response to an electronic or optical command. The discussion below will concentrate on adaptive optics (or the slower active optics) as a relevant example: such systems change the path of light beams, their direction or the wave front emanating from them, usually to correct aberrations.

Lets start with the simpler systems, those that can serve as basis for systems that are more complex. Lets define these systems as being able to correct only one mode at a time. The lowest modes would be those which can be defined by one parameter over the correction area. Zernike decomposition, which is common for optical round apertures, has basic modes as follows: (i) piston correction (given value of the wave front), this mode is important only when using a segmented mirror; (ii) tip and tilt (given value of the wave front derivatives in x and y directions; and (iii) defocus (given value of the wave front curvature).

Piston correction is achieved merely by moving the mirror surface up and down, while maintaining its direction. The size of the elements d is small compared to the lateral scale of the aberrations. Mirror movement in parallel to itself is achieved by piston actuators; these actuators are the basis of most deformable mirrors. Mentioned here are some commonly used devices. Comparative designs and analyses have appeared in J. A. Pearson, R. H. Freeman, and Harold C. Reynolds, Jr., 'Adaptive optical techniques for wave-front correction', in Applied Optics and Optical Engineering Vol. VII, R. R. Shannon and. C. Wyant, editors, Academic Press, 246–340, 1979; M. A. Ealey, 'Actuators: design fundamentals, key performance specifications, and parametric trades', SPIE Vol. 1543, 346–362, 1991; M. A. Ealey and J. A. Wellman, 'Deformable mirrors: design fundamentals, key performance specifications, and parametric trades', SPIE 1543, 36–51, 1991; E. N. Ribak, 'Deformable mirrors', in Adaptive Optics in Astronomy, NATO ASI Vol. 423, 149–62, 1994; R. K. Tyson, Principles of Adaptive Optics, Academic Press, 1998; R. E. Aldrich, 'Deformable mirror wavefront correctors', in Adaptive Optics Engineering Handbook, Marcel Dekker, 2000. The main types of deformable mirrors appear in FIGS. 1a–f, each of which has its limitations.

The most common method of piston correction is by using piezoelectric actuators. These actuators are very convenient since they respond directly and quite linearly to an applied voltage. Their response (for lead zirconium titanate, the most common material) is in the order of 1 micrometer for 1 kV, which is too small to achieve the several microns required to correct for atmospheric turbulence. Only one mirror was used in this configuration: the monolithic piezoelectric mirror[J. S. Feinlieb, S. G. Lipson, and P. E. Cone, 'Monolithic piezoelectric for wavefront correction', Appl. Phys. Lett. Vol. 25, 311–315, 1974], where the electrode contacts were drilled through the actuator block almost to the face of the mirror. A number of schemes were devised for better voltage response. In one scheme use is made of the thickness-to-length ratio: instead of applying the voltage along the most responsive direction, it is applied across this direction. By making the piezoelectric material very long and very thin, the transverse response is amplified by this ratio. Since they are constructed from ceramic materials, these actuators can be manufactured in almost any desired shape. For this application they are prepared in a tubular shape, which is convenient for other applications. Another choice is to bond a stack of many thin slabs of the material, and apply low voltage on all of them in cascade. The slabs are combined with their polarizations directions alternating so that application of the voltage is in parallel.

Another piezoelectric material is lead magnesium niobate, with a better (but uni-directional) voltage response and lower hysteresis [G. H. Blackwood, P. A. Davis, and M. A. Ealey, 'Characterization of MMN:BA electrostrictive plates and SELECT actuators at low temperatures', SPIE Vol. 1543, 422–429, [Blackwood et al., 1991]. This kind of response is called electrostrictive. However, since it always extends, either under positive or negative voltage, a bias voltage must be applied to it for bidirectional movement.

Another option for actuators is the voice coil, such as used in commercial loud speakers. In this case, a magnetic field drives a coil attached to a piston. The drawback here is the heating created by the flowing current. The magnetostrictive actuator consists of a solenoid within which is the magnetostrictive ferrite whose length changes under magnetic field. Here again the actuator has to be rid of the heat in the solenoid. It is easier to use these actuators in a laser adaptive mirror, since both have to be cooled anyway.

The hydraulic actuator is able to provide force by amplification of mechanical force or by employing a valve to control a constant high pressure. Severe drawbacks such as requirements for both a hydraulic system and an electrical one, slow response and large volume make them less convenient to employ.

Finally, electrostatic actuation is used for membrane mirrors, and is discussed further below. A full comparison between the different actuators can be found in the general references cited above.

Tip and tilt correction should be separated from the case of a steering correction. Tip and tilt are required in multi-element systems, where the wave front will not be continuous between actuators. To minimize this effect the tip and tilt are supplemented by piston movement.

A steering mirror only corrects the direction of the incoming beam. It is utilized for telescopes which cannot track in a smooth manner or for initial correction for turbulence-induced wave front tilts. In this capacity it is also employed sometimes as the first stage in an adaptive optics system to reduce requirements on the main deformable mirror. A full list of design parameters for such mirrors can be found in [L. M. Germann, 'Specifications of fine-steering mirrors for line-of-sight stabilization systems', SPIE Vol. 1543, 202–212, 1991].

Steering mirrors have two degrees of freedom, whereas tip-tilt correctors require three. All designs on the market today utilize pistons to push and pull on the back of a high quality mirror. Some of the mirrors are metallic (molybdenum or beryllium) for power applications and for high speed response. The requirement to maintain a flat surface is alleviated if steering mirrors are used as a first stage before a deformable mirror, since a servo loop could correct for the residual errors.

Steering and tip/tilt/piston mirrors can have a number of mechanical designs. One design uses direct piezoelectric actuators or lever-amplified ones. In another design use is made of tubular piezoelectric material. Sectors along the tube are powered separately to both bend and piston the supported mirror. There are also voice coil pistons and electromagnetic pistons. The number of actuators varies between two and four, depending on the specific application.

Defocus can be corrected by a mirror whose radius of curvature can be controlled. This mode of operation can be achieved in the bimorph mirror. In this device, the actuator is not pushing against the back of the mirror or pulling it down, but acts to stretch along the surface of the mirror. In a construction similar to the bimetallic strip, a thin actuator is glued to the surface of a thin mirror. When voltage is applied to it, it expands in area (when thin enough, the lateral contraction is negligible). In a manner similar to the bimetallic strip under heating, this expansion, combined with the inert mirror, leads to the structure curving. Another possibility is to have the actuators glued back to back so that the bending is doubled. In this case they have to be polished properly to optical quality. It can be shown [Steinhaus E., and S. G. Lipson, 'Bimorph piezoelectric flexible mirror', J. Opt. Soc. Am. Vol. 69, 478–481, 1979] that the curvature of the surface is proportional to the applied voltage.

Another way to achieve a spherical surface is by electrostatic pull. A thin conducting membrane is pulled towards a plane and (initially) parallel electrode which is charged to create a capacitor. The amount of charge sets the amount of curvature. A transparent electrode is sometimes required to pull on the membrane in the opposite direction and to protect it from acoustic noise sources[F. Merkle, K. Freischlad, J. Bille, 'Development of an active optical mirror for astronomical applications', ESO Conference on Scientific Importance of High Angular Resolution at Infrared and Optical Wavelengths, 41–44, 1981, M. Clampin, S. T. Durrance, D. A. Golimowski, and R. H. Barkhouser, 'The Johns Hopkins adaptive optics coronograph', SPIE Vol. 1542, 165–74, 1991, G. Vdovin, 'Micromachined membrane deformable mirror', in Adaptive Optics Engineering Handbook, Rk. Tyson, Rd., Marcel Dekker 2000].

So far the discussion was focused on segmented mirrors which are simpler to construct and maintain, easily understood, and straightforward to run. Unfortunately, they cannot mimic the aberrated wave front too well, and they have gaps between the mirrors.

These drawbacks do not exist for the competition: continuous mirrors. Here the front surface consists of a single unit, usually called the face plate or face sheet, and it is acted upon from behind by actuators of various sorts. The actuators separate into two kinds: piston actuators, which act on the face sheet normal to its surface, and bending actuators, which act in parallel to the surface.

Piston actuation: Applying a force normal to the surface requires a special attachment of the actuator to the face plate. The actuator has to push and pull on the surface using some heavy and solid back reference plane. The attachments of the actuator to the base and to the mirror have some special— and sometimes conflicting—requirements:

1. Yield or backlash below the required wave front accuracy (usually below 0.1 micrometer in the normal direction, 0.5 micrometer inside the plane of the face sheet).

2. Possibility for simple and accurate replacement of a faulty actuator (this is especially important for multiple element mirrors).

3. Foot-print (projected area of the actuator on the mirror) allowing high density of elements. The base attachment foot-print also has to allow power lines to the actuator.

4. Print-through (induced local mirror aberration) at the required wave front accuracy (say 0.1 micrometer) at all lateral scales which cannot be corrected by the actuators themselves.

5. Adjustment for zero power: means to set the mirror surface flat if the actuators are not powered (the telescope must still function when the deformable mirror is turned off). In some cases this adjustment can be achieved by a constant bias on the elements, which reduces the dynamic range of the actuators. In these cases the zero adjustment can be coarser and only place the actuator in its application margin.

6. Preloading of the actuators is sometimes required. Piezoelectric actuators, for example, function better against pressure.

7. The three-dimensional shape of the attachment is extremely important for tailoring an appropriate influence function.

8. The frequency response of the structure has to be as linear as possible, and the first resonance frequency high above the atmospheric fastest fluctuations.

A common attachment between actuator and face plate is magnetic. A thin ferromagnetic plate is glued to the back of the face plate. Permanent magnets are used to attach the actuators to it. Another choice is to glue an end piece to the mirror and to attach the actuator to it. In less expensive mirrors the actuator is glued directly to the face plate.

Influence functions: When an actuator pushes or pulls on a mirror, the surface of the mirror attains a hill or a valley shape centered around the attachment point. This shape is called the actuator influence function, although analytic functions do not describe it too well. It depends on the following parameters:

1. Face plate material properties.

2. Actuator attachment geometry and material.

3. Location of neighboring actuators. The distance to the neighbors, their arrangement (square or hexagonal), and even the non-existence of neighbors near the border all affect the influence function.

4. Repeatability of the response of the actuators and their attachments.

The importance of the influence function is in the calculation of the fit of the mirror to the wave front. If each actuator has a three dimensional influence function of its own, than the control computer must perform a very large and time consuming fit of the whole wave front to the whole mirror. Even influence functions whose size is larger than the actuator-to-actuator distance complicate this calculation. Thus, having a constant and repeatable influence function which can be tabulated or modeled by a simple function (e.g., cubic spline, gaussian, cosine) is extremely important. This difficult point was realized and tackled from very early on [see the general references and H. R. Hiddleston, D. David Lyman, and E. L. Schafer, 'Comparisons of deformable mirror models and influence functions', SPIE Vol. 1542, 20–34, 1991]. The problem is much easier for membrane mirrors. The use of faster and larger computers has somewhat reduced the need for a stationary influence function.

Membrane mirrors: Membrane mirrors are those whose face plate is relatively thin. Deformable mirrors which use piston actuation tend to have thicker face plate, since the available force is usually much more than required (although the stroke might be limited). In two cases there is an advantage to thinner surfaces. Both cases allow longer strokes, but are limited in force and have rather high acoustic pick-up. The first case is the electrostatic membrane mirror, which belongs in the piston actuators, and the second is the bimorph mirror, which utilizes bending of the membrane surface.

The electrostatic membrane deformable mirror is essentially made of a set of capacitors which are laid in parallel, both physically and electrically. The membrane is made of a conducting, reflective material of limited thickness (a few microns). This device is the extension of a single such mirror. The electrostatic pull between the surfaces of the capacitor is uni-directional, and it is required to devise some scheme to have a two-directional motion. One way is to bias all the elements at some high voltage, and have all elements move in a small range above and below this bias. This electric bias creates a spherical bias surface which has to be included in the design of the optical system. A way to avoid bias is to put an opposite electrode on the other side of the membrane to pull in the other direction. This electrode is transparent and allows the enclosure of the whole device.

The voltages required to achieve the desired stroke depend on the spacing between the membrane and the opposite electrodes, and range between few volts to hundreds of volts. This spacing cannot be made too small so as to avoid the membrane short-circuiting to the electrodes, and also to allow some air to remain and dampen vibrations of the membrane. Too tight a space is also a problem since the air has no room to escape when the membrane moves. The small room between the electrodes and the membrane require very accurate machining of the electrodes to avoid edge effects (sharp edges have a higher electrostatic field). A biased membrane will require a curved electrode surface to best match its equilibrium position. Finally, the membrane tends to vibrate very easily, so it needs an efficient damping mechanism (such as air) to be included in the design.

Bimorph mirrors: Bimorph mirrors depend on membrane face sheets for flexibility. They are constructed of a thin piezoelectric material bonded to a thin mirror. The curvature depends on the square of ratio of the diameter to the thickness, which explains why they come under the heading of membranes. There are a number of ways to have a multiple electrode bimorph mirror. The first is to have a large piezoelectric sheet attached to a large face sheet. The electrodes are drawn on the back of the piezoelectric sheet in any desired shape[F. Forbes and N. Roddier, 'Adaptive optics using curvature sensing', in SPIE Vol. 1542, 140–147, 1991]. This method is limited due to the fragile nature of the ceramic piezoelectric material that does not allow two high a ratio of the diameter to the thickness.

A second method is to glue many electrodes to the back of a single face sheet[E. N. Ribak, S. G. Lipson, and C. Schwartz, 'Thin mirror adaptation by simulated annealing', ESO Conference on high-resolution imaging by interferometry II, 1991, 'High performance, affordable agile mirror', Air Force workshop on Declassification of Military Technology: Laser Guide Stars, Albuquerque, N. Mex., 1992]. This allows for the same piezoelectric material thickness to effectively increase the size of the device. The draw-back is that a very thin face sheet is sensitive to print-through effects caused by edges of the piezoelectric elements. Glue expansion at the elements edges is a severe problem, which can only be resolved by using thicker face sheet and reducing the voltage sensitivity[C. Schwartz, E. Ribak, and S. G. Lipson, 'Bimorph adaptive mirrors and curvature sensing', J. Opt. Soc. Am. A Vol. 11, 895–902, 1994]. A stroke of one wave length requires between seven and twenty volts, depending on the dimensions of the bimorph.

A significant difference between piston mirrors and membrane mirrors is their voltage response. Each actuator has a spatial response which is linear with its displacement and extends to approximately the next element. Bimorph mirrors can be shown to solve the bi-harmonic equation, or, under simplifying assumptions, the Poisson equation [Steinhaus E., and S. G. Lipson, 'Bimorph piezoelectric flexible mirror', J. Opt. Soc. Am. Vol. 69, 478–481, 1979; C. Schwartz, E. Ribak, and S. G. Lipson, 'Bimorph adaptive mirrors and curvature sensing', J. Opt. Soc. Am. A Vol. 11, 895–902, 1994]. This means that the surface curvature is linear with the voltage distribution, and that this response extends to neighboring elements.

Because curvature is induced, not displacement, the membrane mirror is easier to control using most wave front sensors. Essentially all such sensors measure either the wave front first derivative (Hartmann-Shack sensors, shearing interferometers) or the second derivative (curvature sensors). In order to calculate displacement, it is necessary to integrate the gradient or laplacian measurements once or twice. Differentiating the gradient or directly applying the curvature to the membrane is much simpler[F. Forbes and N. Roddier, 'Adaptive optics using curvature sensing', in SPIE Vol. 1542, 140–147, 1991; C. Schwartz, E. Ribak, and S. G. Lipson, 'Bimorph adaptive mirrors and curvature sensing', J. Opt. Soc. Am. A Vol. 11, 895–902, 1994]. Some modification might be needed because the coupling between the curvature sensor and the bimorph mirror has to take into account coupling between correction terms and edge effects.

Addition of tip/tilt correction: The most severe aberration of the wave front is due to very large scale fluctuations. Since the dynamic range of the stroke of most piston mirrors is quite limited, this low order aberration is often taken care of separately by a steering mirror. The main deformable mirror corrects only residual errors of higher frequency. The situation is better for bimorph mirrors, since their stroke is usually longer. In addition, correction of the lower Fourier components can be achieved on the border and outside the active mirror surface, with virtually no effect on the rest of the elements. This is because the voltage sets the bimorph curvature, and this curvature is independent of the large scale tilt.

Various other devices were proposed for deformable mirrors. Spatial light modulators, useful for image processing, are usually limited by spectral, spatial and temporal band-width. Oil films whose thickness can be varied electrostatically were also proposed in the past, but rejected for the same reasons. Two more options are the utilization of laser corrective mirrors and of liquid crystal modulators.

Corrective laser mirrors: Devices built for correction of laser mode hopping and for transmission of laser beams through turbulence can also serve for astronomical applications. These mirrors are manufactured to tolerate very high intensities, and the mirrors for atmospheric correction also respond at high enough frequency. The face plates are usually metallic (e.g., beryllium, molybdenum) for good thermal conductivity. The structure includes means for liquid cooling of the front surface and sometimes of the actuators. Unfortunately, these qualities make the mirrors extremely complex to construct, maintain, and run.

Liquid crystals: Liquid crystals were proposed for wave front correctors. The mechanism is electro-optical path correction by modulation of nematic liquid crystals. An addressable matrix has the refractive index change by as much as 0.2 on a scale of 10 micrometers. Light reflected through the liquid crystal has its optical path changed at the rate of more than 1 micrometer in 50 ms, which is adequate. A very large demagnification of the telescope aperture is required in order to match it to this device. The technology seems to be maturing towards its application for actual systems [G. D. Love, 'Liquid crystal adaptive optics', in Adaptive Optics Engineering Handbook, R. K. Tyson, Ed., Marcel Dekker, 2000].

System aspects: Here we deal with deformable mirrors as a component in a system. However, some considerations apply regarding the deformable mirror as a subsystem in the adaptive optics system. This is important since the measurement and computation loads are very heavy. The deformable mirror has to be designed to relieve some of this load.

Adaptive optics systems can perform either zonal or modal correction. The first describes correction of local errors, whereas the latter describes correction of modes of either the atmosphere or the telescope. In this view it is possible to design the actuators to match specific modes [Clampin [F. Roddier, J. E. Graves, D. McKenna, and M. Northcott, 'The University of Hawaii adaptive optics system', SPIE Vol. 1542 248–72, 1991; M. Clampin, S. T. Durrance, D. A. Golimowski, and R. H. Barkhouser, 'The Johns Hopkins adaptive optics coronograph', SPIE Vol. 1542, 165–74, 1991]. The advent of fast processors and computers has simplified the systems even more. Instead of calculating specific modes and applying appropriate commands, it is possible to either break the calculation into many parallel processors, where each controls its own mode, or calculate in advance a transfer matrix between inputs and outputs to be applied in every step.

Membrane mirrors, and to a lesser extent piston mirrors, are sensitive to vibrations. The design of the mirrors should be selected so as to maximize the first resonance frequency above typical atmospheric frequencies. Otherwise it is essential to have the control and command circuits reduce the effects of these resonances.

A limiting factor in the design of deformable mirrors is their drivers or amplifiers. Most existing devices require either high voltage or high currents. Their drivers, running in parallel (one each for an actuator), a large volume and create a great amount of heat which has to be disposed off away from the telescope. Thus they have to be isolated from the telescope enclosure to avoid adding to the turbulence. This contradicts the requirement that the transmission lines from the amplifiers to the mirrors should be as short as possible. Low-power systems such as the liquid crystal and the bimorph mirror have an edge since they can be run directly out of the controller without intervening amplifiers.

There is thus a widely recognized need for, and it would be highly advantageous to have, an adaptive mirror devoid of the above limitation. In addition, there is a need for other mechanical devices which can help in maneouvering miniscule elements or devices, such as fiber optics, scanning microscope heads or memory devices reading and writing heads.

SUMMARY OF THE INVENTION

According to one aspect of the present invention there is provided a piezoelectric device comprising a first element of porous crystalline material, a second element being attached to, or integrally formed with, the first element, and at least one electrode being in electrical contact with the first element, such that subjecting the first element to an electric potential via the at least one electrode results in a strain induced by the first element on the second element.

According to another aspect of the present invention there is provided a method of producing a piezoelectric device comprising the steps of attaching to, or integrally forming with, a first element of porous crystalline material, a second element, and attaching to the first element at least one electrode, such that subjecting the first element to an electric potential via the at least one electrode results in a strain induced by the first element on the second element.

According to yet another aspect of the present invention there is provided a piezooptic device comprising a first element of porous crystalline material, a second element being attached to, or integrally formed with, the first element, and a light source, such that subjecting the first element to light originating from the light source results in a strain induced by the first element on the second element.

According to still another aspect of the present invention there is provided a method of producing a piezooptic device comprising the steps of attaching to, or integrally forming with, a first element of porous crystalline material, a second element, and providing at least one light source, such that subjecting the first element to light originating from the at least one light source results in a strain induced by the first element on the second element.

According to an additional aspect of the present invention there is provided a method of inducing strain in a first element, the method comprising the steps of attaching to the first element, or integrally forming with the first element, a second element of porous crystalline material and subjecting the second element to electric potential.

According to still an additional aspect of the present invention there is provided an adaptive reflector comprising a first layer of porous crystalline material being attached to, or integrally formed with, a second layer having a reflective surface.

According to further features in preferred embodiments of the invention described below, the reflective surface is formed as a reflective coat over the first layer.

According to still further features in the described preferred embodiments the reflective surface is designed to reflect ultraviolet waves.

According to still further features in the described preferred embodiments the reflective surface is designed to reflect light waves.

According to still further features in the described preferred embodiments the reflective surface is designed to reflect infrared waves.

According to still further features in the described preferred embodiments the reflective surface is designed to reflect micro waves.

According to still further features in the described preferred embodiments the reflective surface is designed to reflect radio waves.

According to still further features in the described preferred embodiments the adaptive reflector further comprising at least one electrode through which an electric potential is applicable to the first layer.

According to still further features in the described preferred embodiments the adaptive reflector further comprising at least one light source with which light is applicable to the first layer.

According to still further features in the described preferred embodiments the porous crystalline material is porous silicon.

According to still further features in the described preferred embodiments the second element is made of a crystalline material, such as crystal silicon.

According to a further aspect of the present invention there is provided a method of straining a porous crystalline material element, the method comprising the step of subjecting the porous crystalline material element to electric potential.

According to still a further aspect of the present invention there is provided a method of straining a porous crystalline material element, the method comprising the step of subjecting the porous crystalline material element to light.

According to yet a further aspect of the present invention there is provided a method of relaxing a porous crystalline material element which is subjected to an electric potential, the method comprising the step of preventing the electric potential from the porous crystalline material element.

According to still a further aspect of the present invention there is provided a method of relaxing a porous crystalline material element which is subjected to light, the method comprising the step of preventing the light from the porous crystalline material element.

Implementation of the methods and devices of the present invention involves performing or completing selected tasks or steps manually, automatically, or a combination thereof. Moreover, according to actual instrumentation and equipment of preferred embodiments of the methods and devices of the present invention, several selected steps could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the methods and devices of the invention could be described as being performed by a data processor, such as a computing platform for executing a plurality of instructions. In addition, various strain and other sensors may be integrated in any of the devices of the present invention so as to monitor, feedback and control, via the specified hardware, the operation of a piezoelectric or piezooptic based devices of the present invention. Such sensors are well known in the art.

The present invention successfully addresses the shortcomings of the presently known configurations by providing novel piezoelectric and piezooptic devices and applications therefor.

BRIEF DESCRIPTION OF THE DRAWINGS

The file of this patent contains at least one drawing executed in color. Copies of this patent with color drawings are provided to the Patent and Trademark Office with payment of the necessary fee.

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this, no attempt is made to show structural details of the invention in more detail than is necessary for a fundamental understanding of the invention, the description taken with the drawings making apparent to those skilled in the art how the several forms of the invention may be embodied in practice.

In the drawings:

FIGS. 1a–f show simplified cross sections of several prior art deformable mirrors: (a) piston activation of flat mirrors; (b) piston activation of a continuous mirror; (c) a piezoelectric monolithic mirror; (d) electrostatic membrane mirror; (e) bending moments using pistons operable with either segmented mirrors or continuous mirrors; and (f) a bimorph mirror.

Figure 2:
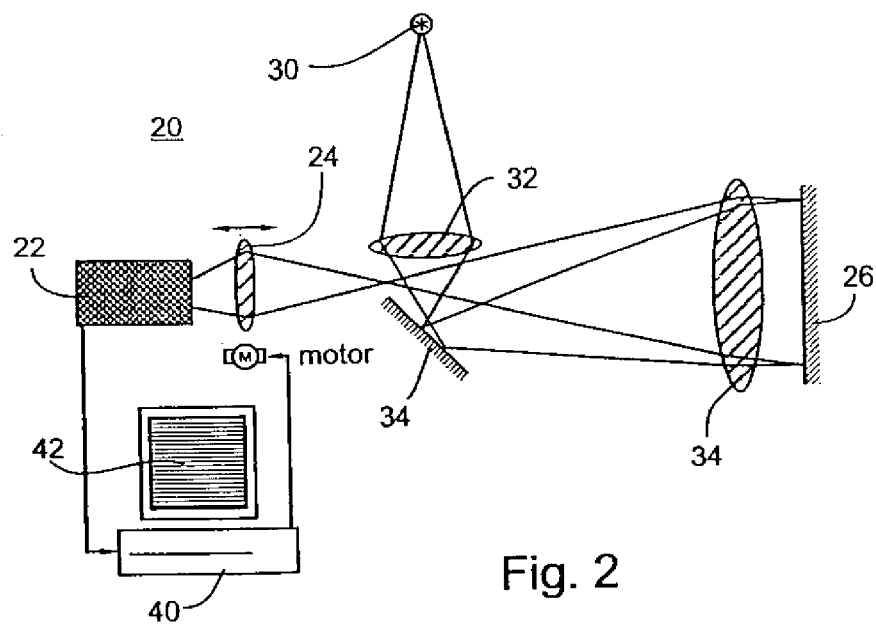

FIG. 2 is a schematic depiction of an optical measurement system based on a curvature wave front sensor. A point source is collimated and reflected off a sample. A moving lens images two planes—the sample and one close to it—alternately on the camera. The off-sample plane exhibits intensity changes as a function on voltage on the sample. All these images are grabbed into the computer and processed to yield the voltage response of the surface of the mirror.

Figure 3:
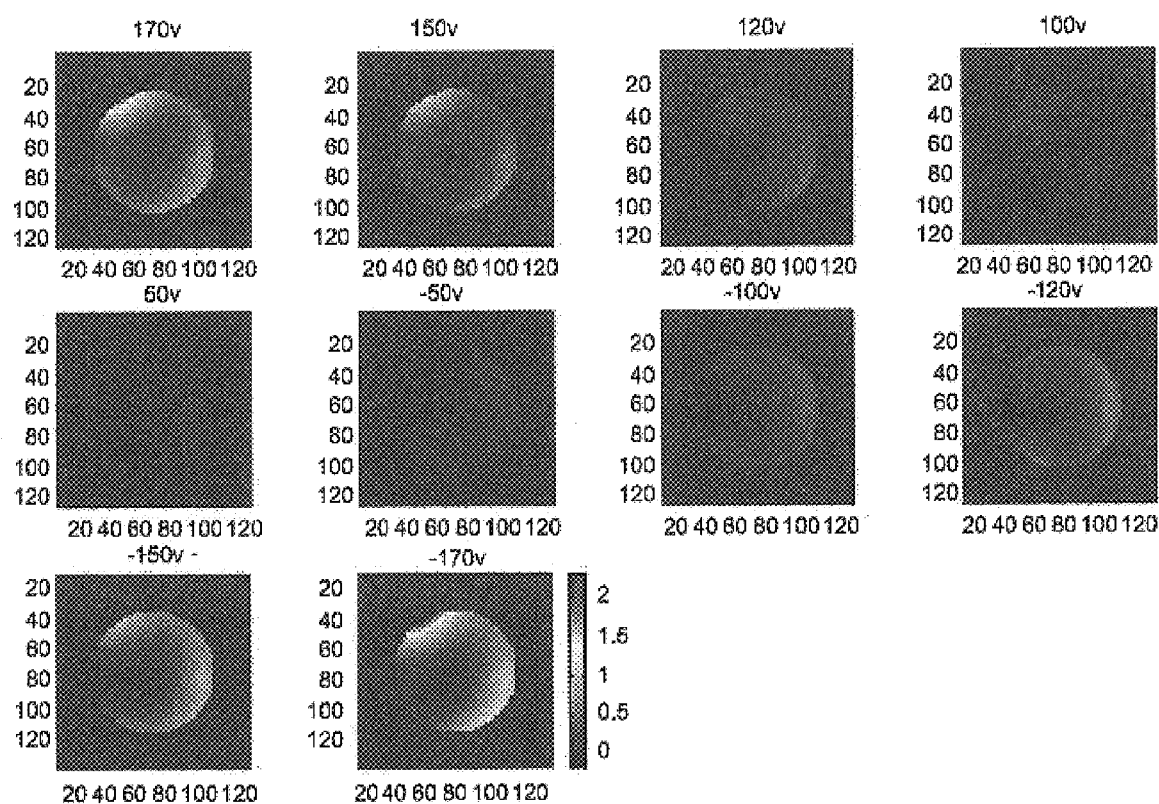

FIG. 3 shows dependence of the silicon-porous silicon bimorph mirror on voltage. One sees the reconstructed wave front reflected off the mirror, after subtraction of the wave front at zero volts. The mirror was slightly curved due to the manufacture process: the front side of a 200 micrometer thick n-type 100-silicon wafer was evaporated with aluminum; the back side was etched in 50% HF-ethanol=1:1 for 35 minutes, at current density of 24 mA/cm$^2$ under 50 Watt halogen illumination. The porous layer created was 50 micrometers thick, and was further passivated in oxygen at 450° C. for 30 minutes. Two wires were attached by silver paint to the porous surface and one to the front aluminized surface, serving as ground. The diameter of the wafer was 51 mm, of the porous silicon 26 mm, and of each electrode 2 mm. The visible section shows 15 mm of the sample, with two electrodes, one at the bottom right of this section and one at the top left. Elevation units are in micrometers.

Figure 4A:
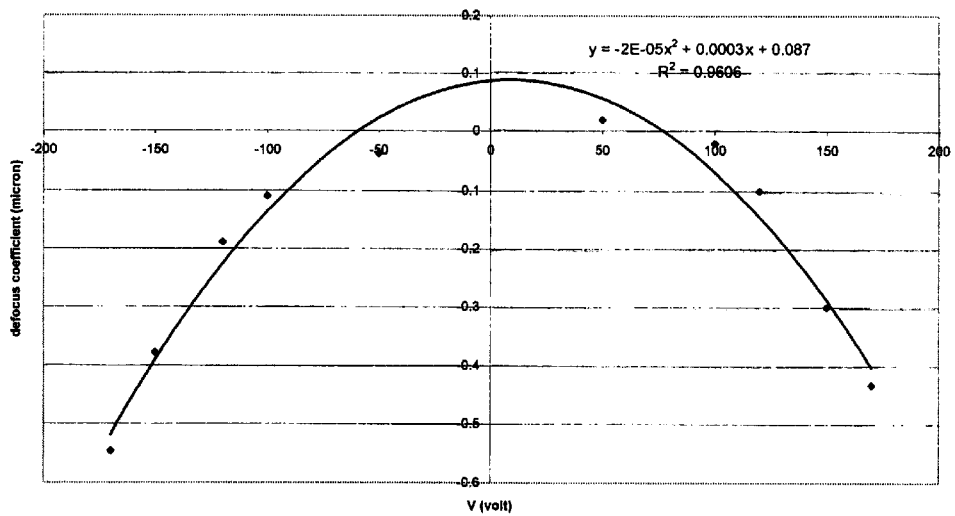
Figure 4B:
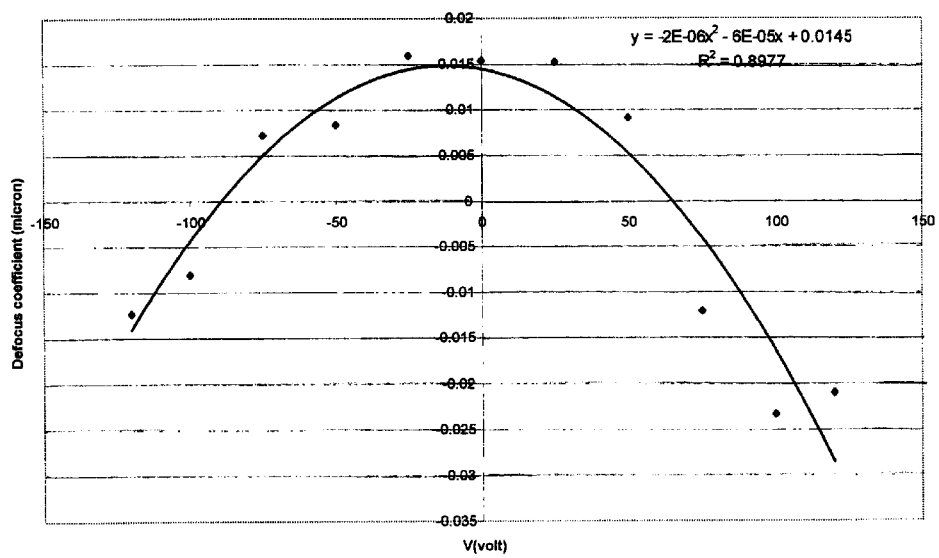

FIGS. 4a–b show typical dependence of the curvature (Zernike defocus coefficient) of the wafer on the voltage for two samples. The curvature was measured over the whole wafer, and not near the electrodes where it peaks.

Figure 5:
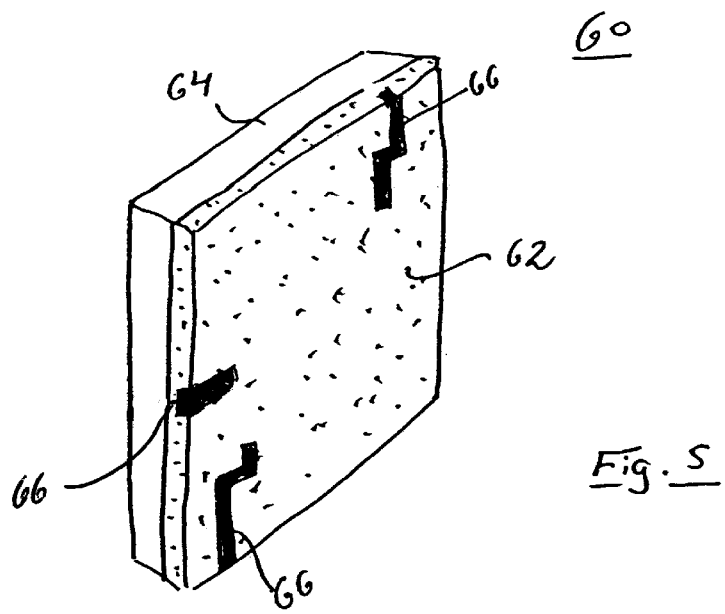

FIG. 5 is a simplified perspective view of a piezoelectric device according to the present invention.

Figure 6:
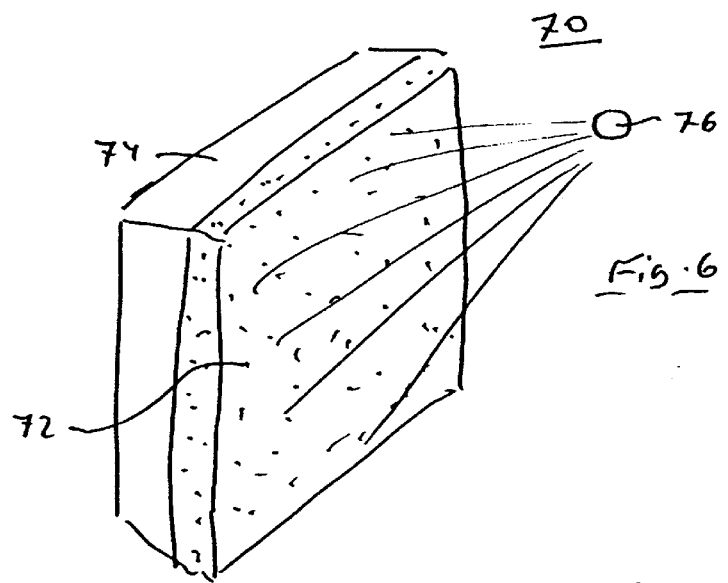

FIG. 6 is a simplified perspective view of a piezooptic device according to the present invention.

Figure 7:
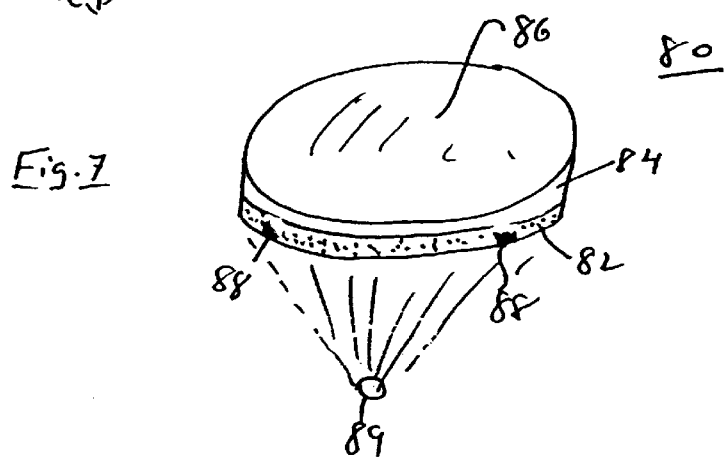
Figure 1A:
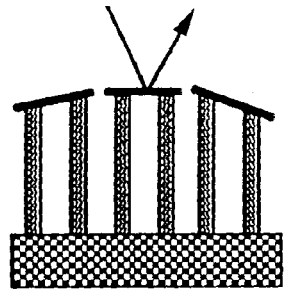
Figure 1B:
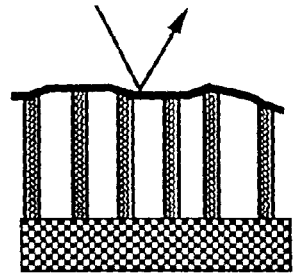
Figure 1C:
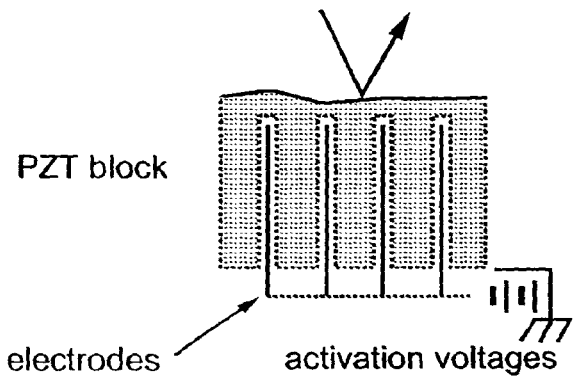
Figure 1D:
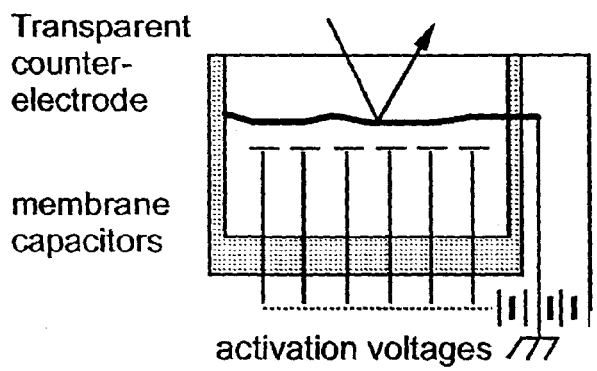
Figure 3:
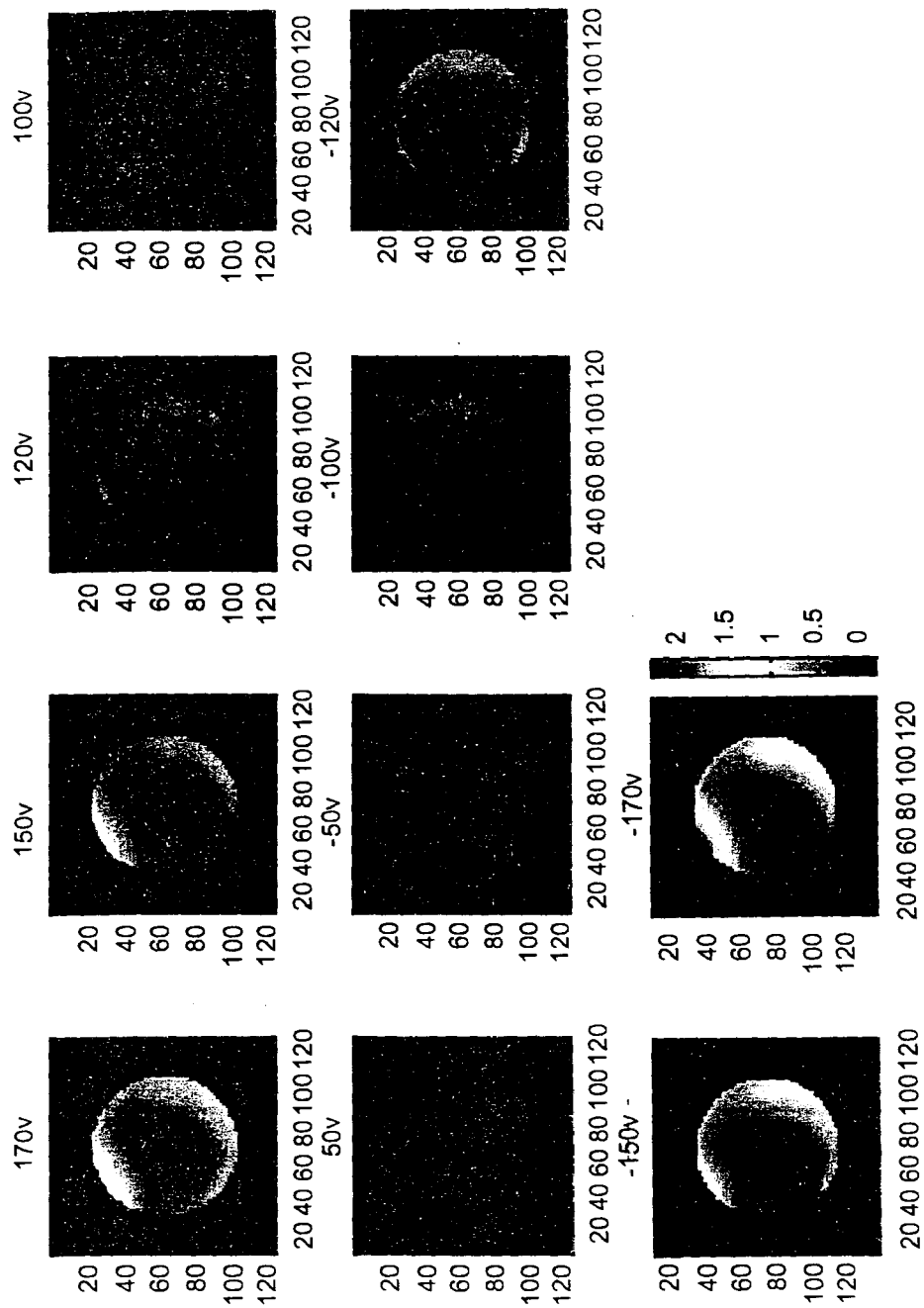
Figure 4A:
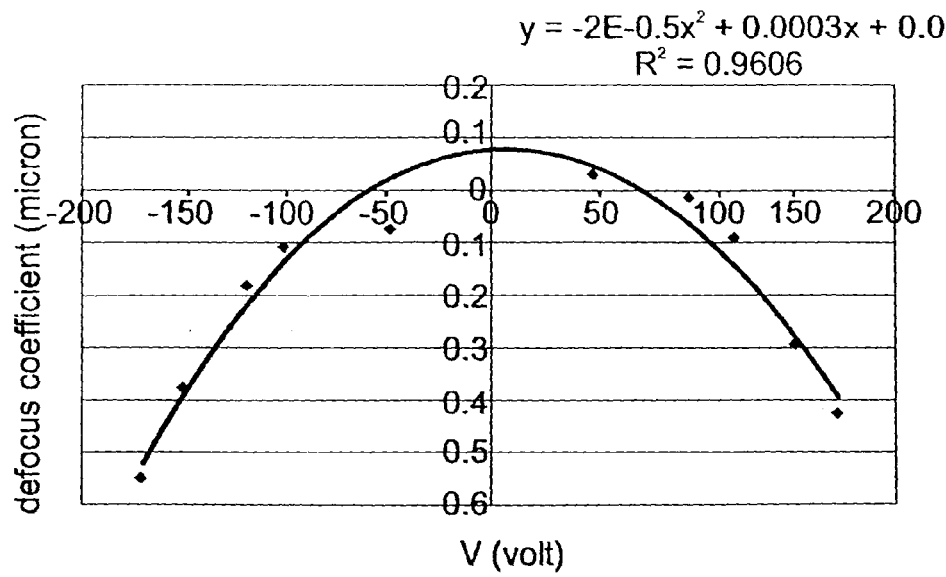
Figure 4B:
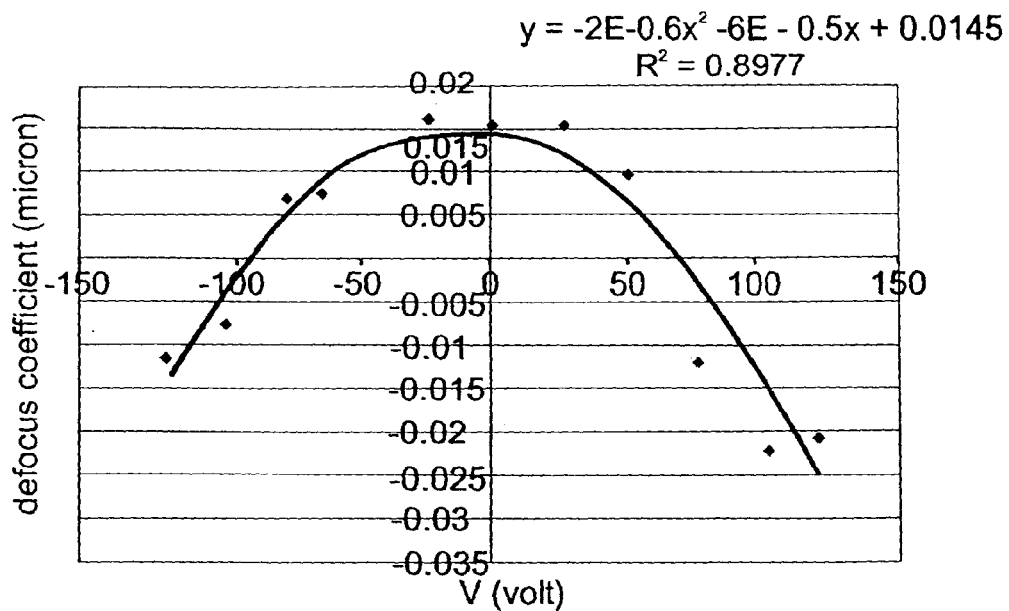
Figure 1E:
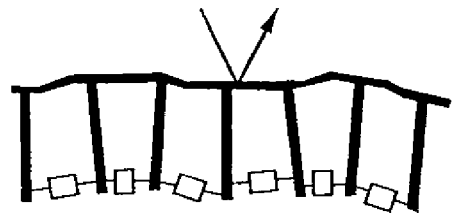
Figure 1F:
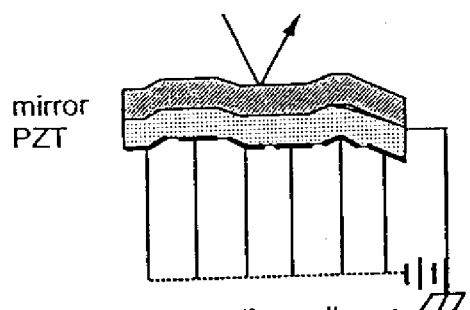

FIG. 7 is a simplified perspective view of an adaptive reflector according to the present invention.

DESCRIPTION OF THE PREFERRED EMBODIMENTS

The present invention is of piezoelectric and piezooptic devices, methods of their fabrication and uses thereof. Specifically, the present invention is of piezoelectric and piezooptic devices including porous crystalline materials.

The principles and operation of the present invention may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

In recent years crystalline silicon micromachining technology has enabled the development of numerous miniaturized devices such as chemical reaction chambers, microactuators, micro-grippers, microvalves, etc. Also, it has been recently established that miniaturized porous silicon structures can be fabricated using micromachining technology. To this end, see, for example, P. C. Searson, 'Porous Silicon Membranes', Appl. Phys. Lett. Vol. 59, 1991; and S. Ottow et al., 'Processing Of Three-Dimensional Microstructures Using Microporous n-Type Silicon', J. Electrochem. Soc., Vol. 143, 1996. A general review can be found in L. Canham, Ed., Properties of Porous Silicon, INSPEC 1997. Porous silicon is a material that is fabricated from crystalline silicon. Very small pores (nm-micrometer diameters) can be introduced with a relatively high degree of uniformity and control.

While reducing the present invention to practice it was discovered that porous silicon, and potentially other materials, have piezoelectric and piezooptic characteristics. The following embodiments of the present invention take advantage of the newly discovered piezoelectric and piezooptic behavior of porous crystalline materials.

FIG. 5 shows a piezoelectric device in accordance with the teachings of the present invention, which is referred to hereinbelow as device 60. Device 60 includes a first element 62. Element 62 is of porous crystalline material, such as, but not limited to, porous silicon. Device 60 further includes a second element 64 which is attached to, or integrally formed with, first element 62. Device 60 further includes at least one electrode 66 (three are shown) which is in electrical contact with first element 62. The arrangement of the above components is selected such that subjecting first element 62 to an electric potential via electrode(s) 66 results in a strain induced by first element 62 on second element 64. A method of producing a piezoelectric device according to the present invention is effected by attaching to, or integrally forming with, a first element of porous crystalline material, a second element, and attaching to the first element at least one electrode, such that subjecting the first element to an electric potential via the electrode(s) results in a strain induced by the first element on the second element.

FIG. 6 shows a piezooptic device in accordance with the teachings of the present invention, which is referred to hereinbelow as device 70. Device 70 includes a first element 72. Element 72 is of porous crystalline material, such as, but not limited to, porous silicon. Device 70 further includes a second element 74 which is attached to, or integrally formed with, first element 72. Device 70 further includes a light source 76, such that subjecting first element 72 to light originating from light source 76 results in a strain induced by first element 72 on second element 74. A method of producing a piezooptic device according to the present invention is effected by attaching to, or integrally forming with, a first element of porous crystalline material, a second element, and providing at least one light source, such that subjecting the first element to light originating from the at least one light source results in a strain induced by the first element on the second element.

According to an additional aspect of the present invention there is provided a method of inducing strain in an element. The method according to this aspect of the invention is effected by attaching to first element, or integrally forming with the element, a second element of porous crystalline material and subjecting the second element to electric potential.

FIG. 7 shows an adaptive reflector in accordance with the teachings of the present invention, which is referred to hereinbelow as reflector 80. Reflector 80 includes a first layer 82 of porous crystalline material which is attached to, or integrally formed with, a second layer 84 having a reflective surface 86. Surface 80 may be formed as a reflective coat over first layer 82, or alternatively or additionally, layer 82 may be polished so as to serve as a reflecting surface. According to one embodiment of this aspect of the present invention reflective surface 86 is designed to reflect light waves, e.g., infrared, visible or ultraviolet light waves, such that reflector 80 is an adaptive light reflector, or in other words, an adaptive mirror. According to another embodiment of this aspect of the present invention reflective surface 86 is designed to reflect micro waves. In this case, a microwave reflecting coat, made of a substance, such as, but not limited to, a metallic layer or a metallic net, is applied onto surface 86. According to another embodiment of this aspect of the present invention reflective surface 86 is designed to reflect radio waves. In this case, a radio wave reflecting coat, made of a substance, such as, but not limited to, a metallic layer or a metallic net, is applied onto surface 86.

According to a presently preferred embodiment of the present invention, and as is further shown in FIG. 7, adaptive reflector 80 further includes at least one electrode 88, through which an electric potential is applicable to first layer 82. According to an alternative embodiment, adaptive reflector 80 further includes at least one light source 89 with which light is applicable to first layer 82.

The structure of the porous crystalline material is important to its piezoelectric/piezooptic response. In low-porosity materials, the residual matter is not made of separate islands, and thus its conduction is high and the application of voltage to it results in short-circuiting between the electrodes (percolation). When the pores capture a larger fraction of the porous matter, it is possible to have an applied voltage. The percentage porosity of the percolation limit is different with different raw silicon stoichiometry, orientation, processing procedure and processing chemicals. It will, however, be appreciated in this respect that these structural parameters of porous crystalline materials are controllable through their manufacturing methods.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

EXAMPLES

Reference is now made to the following examples, which together with the above descriptions, illustrate the invention in a non limiting fashion. While investigating the properties of porous silicon, a new type of a deformation mechanism was uncovered, transverse electrostatic strain, by which it is possible to induce strains in an attached element, such as membrane mirror.

Example 1
Construction of a Mirror

The mirror was constructed of a silicon wafer, polished on both sides, whose front (mirror) side was evaporated with a reflective layer and the wafer was annealed at 450° C. for approximately 30 minutes. 1" or 2" n-type wafers were used, with a diameter of the porous area of 0.5" and 1". The back side of the wafer was made porosive by etching in HF:ehanol (1:1) solution, with the HF itself dissolved in water (1:1). An initial current of 120–130 mA, (24 mA/cm$^2$) was applied to the sample, while it was illuminated by a 50 W halogen lamp. The etching lasted for about 35 minutes, which sets the thickness of the porous layer to 50 micrometers. The sample was washed a few times by ethanol, then left in ethanol for 30 minutes for final removal of the HF. It was then passivated by growing oxygen on the porous layer, in oxygen atmosphere for 30 minutes at 450° C. This is a standard processing technique of silicon wafers, and requires rather a simple equipment. Electrodes were then made on the porous silicon. As is further exemplified hereinunder, application of voltage between the different electrodes and between the electrodes and the silicon wafer (whose resistance is negligible) or application of light onto the porous silicon lead to deformation of the porous matter, while the unetched side did not deform. As a result, the induced stress lead to bending of the wafer in a non-local manner, similar to that of a bimorph mirror [Steinhaus E., and S. G. Lipson, 'Bimorph piezoelectric flexible mirror', J. Opt. Soc. Am. Vol. 69, 478–481, 1979].

Example 2
Theoretical Consideration

Another way to look at the mirror is to think about it as a set of pistons operating parallel to the surface of the mirror, pulling the elements towards each other and creating bending moments.

The strain of a plate made of two such layers can be shown to follow the biharmonic equation, which can further be reduced to the harmonic (Poisson) equation for simple boundary conditions. Since in electrostatic pull the stress is proportional to the square of the voltage, the reflected wave front excursions W(r) (equal to twice the strain) are assumed to follow:

$$\nabla^2 W(r) = \gamma[dV(r) + mV^2(r)]$$

where V(r) is a continuous description of the voltage on the electrodes. d and m the piezoelectric and electrostrictive constants, and γ depends on geometrical factors and Poisson's ratio and Young modulus of the porous silicon and crystal silicon[C. Schwartz, E. Ribak, and S. G. Lipson, 'Bimorph adaptive mirrors and curvature sensing', J. Opt. Soc. Am. A Vol. 11, 895–902, 1994]. In this equation, one can measure W(r) and V(r), and determine γ separately. This allows one to determine the constants d and m.

In order to determine the dependence of strain on voltage, a curvature sensor Tyson[F. Roddier, J. E. Graves, D. McKenna, and M. Northcott, 'The University of Hawaii adaptive optics system', SPIE Vol. 1542 248–72, 1991; R. K. Tyson, Principles of Adaptive Optics, Academic Press, 1998] was employed. The intensity distribution when focused on the sample, and again at a small distance z away from it Vinikman[E. N. Ribak and S. Vinikman, 'Curvature sensing and intensity transport', in Adaptive Optics for Insdustry and Medicine, Ed. G. D. Love, World Scientific, 1999] was measured. The intensity distribution was constant at the sample, and varied as the curvature of the reflected wave front when out of focus. The calculations stems out of the Transport of Intensity Equation[N Streibl, 'Phase Imaging by the Transport Equation of Intensity', Opt. Comm. Vol. 49, 6–10, 1984; M. R. Teague, 'Deterministic Phase Retrieval: A Green's Function Solution', J. Opt. Soc. Am. Vol. 73, 1434–41, 1983] which relates the intensity along the path and the phase by:

$$k\frac{\partial}{\partial z} I(r, z) = -\nabla \cdot [I(r, z)\nabla \varphi(r, z)],$$

where $\nabla^2 = \partial^2|\partial x^2 + \partial^2|\partial y^2$; $k=2\pi/\lambda$. For $I(x,y,z=0)=I_0=$const, this equation reverts to the curvature equation:

$$-\frac{k}{I_0}\frac{\partial I(r, z)}{\partial z} = \nabla^2 \varphi + \delta(e)\frac{\partial \varphi}{\partial \bar{n}}; \quad e = \text{edge},$$

where $\bar{n}$ is the normal vector at the edge of the measured sample. This is combined with Neumann boundary conditions $\partial\phi/\partial\bar{n}$ measured through the intensity around $\delta(e)$. One can approximate the longitudinal derivative as:

$$\frac{1}{I_0}\frac{\partial I(r, z)}{\partial z} \approx \frac{I(r, z-\Delta z) - I(r, z+\Delta z)}{I_0 \cdot 2\Delta z} \approx \frac{1}{\Delta z}\frac{I(r, z-\Delta z) - I(r, z+\Delta z)}{I(r, z-\Delta z) + I(r, z+\Delta z)}.$$

Example 3
An Optical System Incorporating the Mirror

Referring now to FIG. 2, a simple optical system 20 was constructed that allows one to re-image different planes on a camera 22. System 20 includes a point source 30 and a lens 32 so as to focus light just before a surface of a mirror 34. Mirror 34 is so positioned so as to reflect the light through a collimating lens 34 onto a sample 26, which is a mirror in accordance with the teachings of the present invention made and constructed as described hereinabove, and from which the light is reflected back through lens 34 to a motorized (M) focusing lens 36 which focuses the light onto a CCD camera 22. By moving lens 24 in front of camera 22, one can choose two planes to overlap (before and after reflection from sample 26), or at any two other locations using a frame grabber 40 and an appropriate computer 42 and software.

In order to find the response of the mirror to voltage, it is easier to focus one of the locations at the mirror surface itself, and the second at a distance z off the mirror. Since the sensitivity of the method depends on the distance from the focus, the first plane will not be sensitive to phase variations at all, and all the changes will be limited to the second plane. This placement of the planes does not require back-and-forth focusing whenever one wishes to take a measurement: the first intensity measurement does not vary with wave front changes. If one takes two measurements with and without voltage, and subtract them, the focus measurement will drop out. The modified relationship between the intensities and the displacement is:

$$I_v(r) - I_0(r) = z I_F(r) \nabla^2 W(r)$$

where $I_F(r)$, $I_V(r)$ and $I_0(r)$ are now the intensities at focus, and off-focus with and without voltage. The equation was solved with Dirichlet boundary conditions and the surface profile $W(r)$ deduced. This was repeated for different voltages (FIG. 3) and the value of the curvature assessed near the electrode (FIG. 4). The piezoelectric constant was found to be $d = 5.0 \cdot 10^{-8}$ m/V and the electrostrictive constant $m = 1.4 \cdot 10^{-9}$ m/V$^2$. At this stage, isotropy of these constants is assumed, although for n-type porous silicon, with preferred direction of the pores normal to the layer, this might not be accurate. Most of the non-quadratic response arises from the voltage difference between the non-adjacent electrodes, which at first order is a linear correction on the quadratic voltage dependence between the electrode and the silicon substrate.

The piezoelectric and electrostrictive response of the porous silicon can be attributed to a number of processes, the foremost of which is electrostatics pull between the porous crystalline material under the electrodes. This is supported by the fact that the response is governed by the absolute value of the voltage, as in the pull between capacitor plates.

It is also possible that Joule heating of the porous matter is a source for the measured strain or part of it [H. Shinoda, T. Nakjima, K. Ueno, N. Koshida, 'Thermally induced ultrasonic emission from porous silicon', Nature Vol. 400, 6747, 853–855, 1999]. This heating can be found from the knowledge of the power applied to it: it is either the product of the current I and voltage V on the sample, or the light intensity on it. The I-V characteristics are odd (that is, the dependence of power on the sample is different when the voltage is positive or negative), while the voltage dependence of the strain is nearly even (i.e. independent of the polarization of the voltage).

Heating of the samples can also arise because of creation of plasma in the porous volume. Slight variations between the samples allowed to raise the voltage only up to 50–200 Volts, probably due to breakdown and plasma creation in the passivated porous matter. Difference between samples arises because the distance between pores and conducting paths inside the silicon are sensitive to the porosity of the sample.

The time response of the material is rather slow, and it reaches its peak strain only after a minute of applied voltage. This was measured by taking a series of images of the sample as voltage was applied to it or as it was illuminated.

Illumination of the porous silicon with a 6 mW HeNe laser had a similar but much weaker effect. Without being limited by any theory, it is possible that this piezooptic response is a secondary result of voltage developing in the illuminated porous silicon. This raises the option of controlling the shape of the mirror optically rather than electronically.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A piezooptic device comprising a first element of porous crystalline material, a second element being attached to, or integrally formed with, said first element, and a light source, such that subjecting said first element to light originating from said light source results in a strain induced by said first element on said second element.

2. The piezooptic device of claim 1, wherein said porous crystalline material is selected from the group consisting of porous silicon, or other material with conductive channels and isolating channels such as spaces.

3. The piezooptic device of claim 1, wherein said second element is made of a crystalline material.

4. An adaptive reflector comprising the piezooptic device of claim 1, and a reflecting surface attached thereto.

5. The adaptive reflector of claim 4, wherein said reflective surface is formed as a reflective coat over said first layer.

6. The adaptive reflector of claim 4, wherein said reflective surface is designed to reflect light waves.

7. The adaptive reflector of claim 4, wherein said reflective surface is designed to reflect micro waves.

8. The adaptive reflector of claim 4, wherein said reflective surface is designed to reflect radio waves.

9. A method of producing a piezooptic device comprising the steps of attaching to, or integrally forming with, a first element of porous crystalline material, a second element, and providing at least one light source, such that subjecting said first element to light originating from said at least one light source results in a strain induced by said first element on said second element.

10. The method claim 9, wherein said porous crystalline material is selected from the group consisting of porous silicon, or other material with conductive channels and isolating channels such as spaces.

11. The method of claim 9, wherein said second element is made of a crystalline material.

* * * * *

UNITED STATES PATENT AND TRADEMARK OFFICE
CERTIFICATE OF CORRECTION

PATENT NO. : 6,728,024 B2
DATED : April 27, 2004
INVENTOR(S) : Ribak

It is certified that error appears in the above-identified patent and that said Letters Patent is hereby corrected as shown below:

Title page,
Item [*] Notice, should read:
 -- Subject to any disclaimer, the term of this patent is extended or adjusted under 35 U.S.C. 154(b) to 83 days. --

Drawings,
Substitute formal drawings for informal drawings.

Signed and Sealed this

Seventh Day of September, 2004

JON W. DUDAS
*Director of the United States Patent and Trademark Office*

(12) United States Patent
Ribak

(10) Patent No.: US 6,728,024 B2
(45) Date of Patent: Apr. 27, 2004

(54) VOLTAGE AND LIGHT INDUCED STRAINS IN POROUS CRYSTALLINE MATERIALS AND USES THEREOF

(75) Inventor: Erez N. Ribak, Haifa (IL)

(73) Assignee: Technion Research & Development Foundation Ltd., Haifa (IL)

(*) Notice: Subject to any disclaimer, the term of this patent is extended or adjusted under 35 U.S.C. 154(b) by 83 days.

(21) Appl. No.: 10/060,143

(22) Filed: Feb. 1, 2002

(65) Prior Publication Data

US 2002/0101130 A1 Aug. 1, 2002

Related U.S. Application Data

(62) Division of application No. 09/613,759, filed on Jul. 11, 2000.

(51) Int. Cl.[7] .............................. G02F 1/29; G02F 1/00; H01L 41/18
(52) U.S. Cl. ................... 359/299; 359/321; 310/311
(58) Field of Search ........................ 359/299, 321; 310/311

(56) References Cited

U.S. PATENT DOCUMENTS 4,524,294 A * 6/1985 Brody ...................... 310/311

FOREIGN PATENT DOCUMENTS

| JP | 8-32132 | * | 2/1996 |
| JP | 8-46259 | * | 2/1996 |

* cited by examiner

Primary Examiner—Georgia Epps
Assistant Examiner—William Choi
(74) Attorney, Agent, or Firm—G.E. Ehrlich (1995), Ltd.

(57) ABSTRACT

A piezoelectric device is disclosed, which includes a first element of porous crystalline material, a second element being attached to, or integrally formed with, the first element, and at least one electrode being in electrical contact with the first element, such that subjecting the first element to an electric potential via the at least one electrode results in a strain induced by the first element on the second element. Also disclosed is a piezooptic device which includes a first element of porous crystalline material, a second element being attached to, or integrally formed with, the first element, and a light source, such that subjecting the first element to light originating from the light source results in a strain induced by the first element on the second element.

11 Claims, 4 Drawing Sheets

(1 of 4 Drawing Sheet(s) Filed in Color)

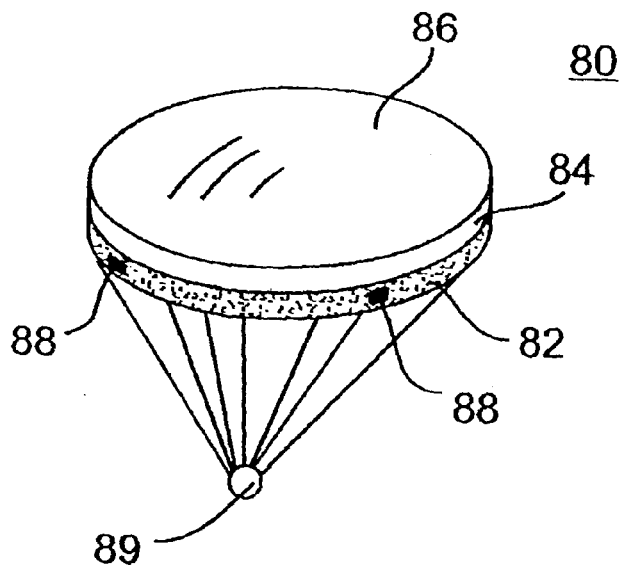

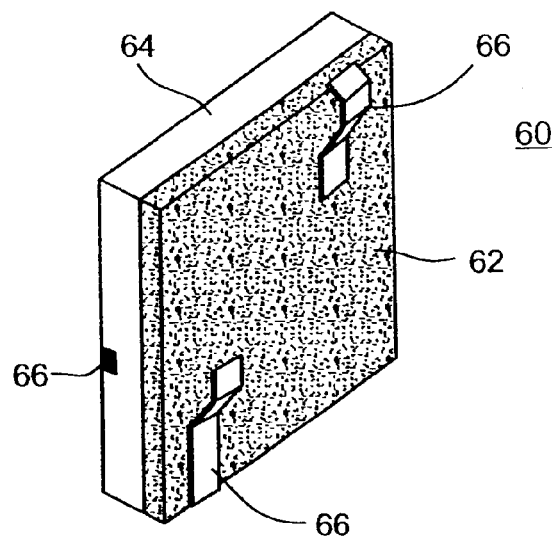
Fig. 5
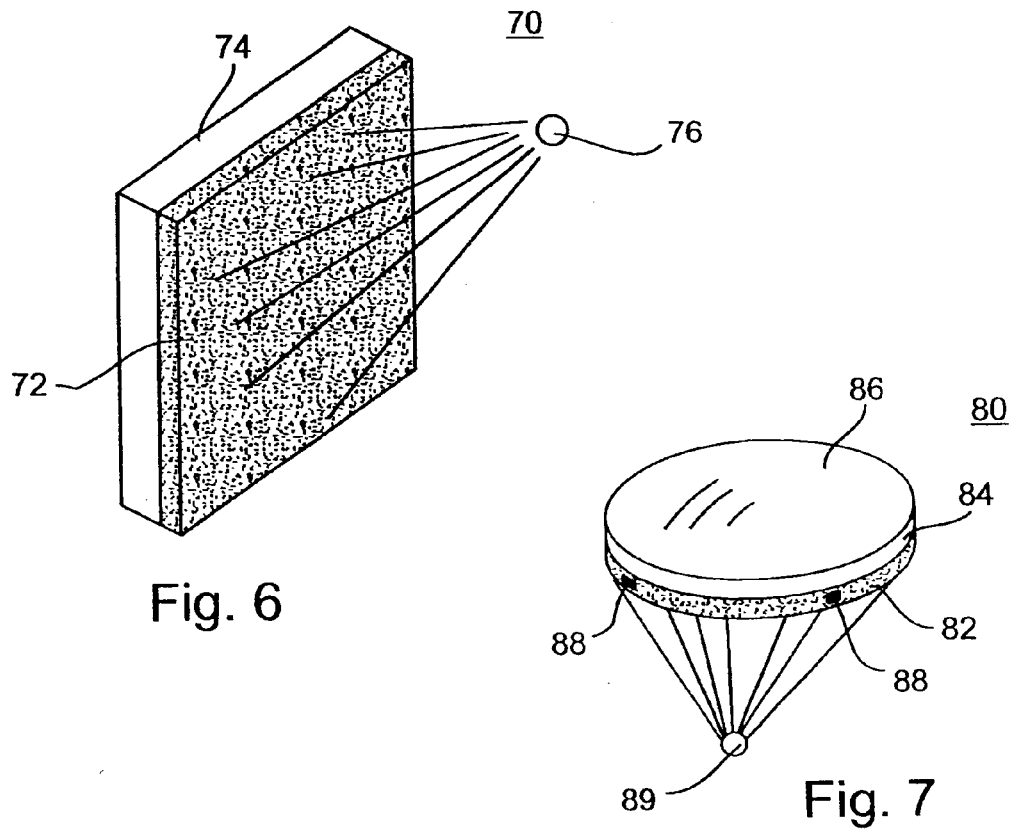
Fig. 6
Fig. 7

UNITED STATES PATENT AND TRADEMARK OFFICE
CERTIFICATE OF CORRECTION

PATENT NO.    : 6,728,024 B2
DATED         : April 27, 2004
INVENTOR(S)   : Ribak It is certified that error appears in the above-identified patent and that said Letters Patent is hereby corrected as shown below:

Drawings,
Please substitute enclosed formal drawing, sheet 2 of 5, for informal drawing, sheet 1 of 4.

Signed and Sealed this

Ninth Day of November, 2004

JON W. DUDAS
*Director of the United States Patent and Trademark Office*